(12) United States Patent
Hildebrant (10) Patent No.: US 8,010,933 B2
(45) Date of Patent: Aug. 30, 2011

(54) SOURCE SYNCHRONOUS TIMING EXTRACTION, CYCLIZATION AND SAMPLING

(75) Inventor: Andrew S. Hildebrant, Loveland, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 771 days.

(21) Appl. No.: 11/481,593

(22) Filed: Jul. 6, 2006

(65) Prior Publication Data

US 2006/0253812 A1 Nov. 9, 2006

Related U.S. Application Data

(63) Continuation of application No. 10/790,960, filed on Mar. 1, 2004, now Pat. No. 7,100,132.

(51) Int. Cl.
G06F 11/22 (2006.01)
G06F 17/50 (2006.01)
G06F 9/455 (2006.01)
G06F 11/00 (2006.01)
G01R 31/28 (2006.01)

(52) U.S. Cl. ............ 716/136; 716/113; 703/14; 703/15; 703/16; 703/17; 703/19; 714/738; 714/741

(58) Field of Classification Search .................. 716/4, 6, 716/136, 113; 703/14–17, 19; 714/738, 714/741
See application file for complete search history.

(56) References Cited

U.S. PATENT DOCUMENTS

| 6,678,643 | B1 | 1/2004 | Turnquist et al. |
| 7,260,168 | B2 * | 8/2007 | Taylor et al. ................... 375/375 |
| 2002/0188888 | A1 * | 12/2002 | Rivoir ............................ 714/25 |
| 2003/0046052 | A1 | 3/2003 | Wheeler et al. |
| 2003/0217343 | A1 | 11/2003 | Rajsuman et al. |
| 2003/0217345 | A1 | 11/2003 | Rajsuman et al. |
| 2004/0047441 | A1 * | 3/2004 | Gauthier et al. ............... 375/376 |
| 2005/0041683 | A1 * | 2/2005 | Kizer ............................ 370/463 |
| 2005/0044463 | A1 * | 2/2005 | Frisch ........................... 714/738 |
| 2005/0108490 | A1 * | 5/2005 | Vogt .............................. 711/167 |
| 2005/0229121 | A1 | 10/2005 | Hildebrant |

* cited by examiner

*Primary Examiner* — Suresh Memula
(74) *Attorney, Agent, or Firm* — Holland & Hart, LLP (57) ABSTRACT

A method for injecting timing irregularities into test patterns self-generated by a device under test (DUT) includes obtaining timing irregularities, receiving the test patterns generated by the device under test driven from output drivers of the DUT, injecting the timing irregularities into the test patterns to generate test patterns with timing irregularities injected therein, and applying the test patterns with timing irregularities injected therein to input receivers of the DUT. A tester is configured to test loopback functionality of a device under test (DUT) utilizing a timing irregularities injection apparatus which receives timing irregularity data readable by the tester and test data generated by the DUT, and injects the timing irregularity data into the test data for application to the DUT.

12 Claims, 10 Drawing Sheets

FIG. 1

$ date
	2/28/2004 1:30:15 PM
$end $version
	Example Clean Receive Data
$end $timescale
	1ps
$end $scope module U $end
$var wire 1 !!RxD ReceiveData $end
$upscope $end $enddefinitions $end

0
$dumpvars
1!!RxD
$end
70
0!!RxD
120
1!!RxD
170
0!!RxD
220
1!!RxD
270
0!!RxD

FIG. 2A

$ date
	2/28/2004 1:30:15 PM
$end $version
	Example Clean Receive Data
$end

$timescale
	1ps
$end $scope module U $end
$var wire 1 !!RxD ReceiveData $end
$upscope $end $enddefinitions $end

0
$dumpvars
1!!RxD
$end
75
0!!RxD
125
1!!RxD
165
0!!RxD
230
1!!RxD
265
0!!RxD

FIG. 3A

```
$ date
        2/28/2004 1:30:15 PM
$end $version
        Example Clean Receive Data
$end $timescale
        1ps
$end $scope module U $end
$var wire 1 !!RxD ReceiveData $end
$upscope $end $enddefinitions $end

0
$dumpvars
1!!RxD
$end
75
0!!RxD
#130
1!!RxD
#185
0!!RxD
#240
1!!RxD
#295
0!!RxD
```

FIG. 4A

```
$ date
        2/28/2004 1:30:15 PM
$end $version
        Example Clean Receive Data
$end $timescale
        1ps
$end $scope module U $end
$var wire 1 !!RxD ReceiveData $end
$upscope $end $enddefinitions $end

0
$dumpvars
1!!RxD
$end
#80
0!!RxD
#135
1!!RxD
#180
0!!RxD
#250
1!!RxD
#290
0!!RxD
```

```
$ date
        2/28/2004 1:30:15 PM
$end $version
        Jitter Example
$end $timescale
        1ps
$end $scope module U $end
$var wire 1 !!
$var wire 1 !!RxD ReceiveData
$end
$var wire 1 !!RxCLK ReceiveClock
$end
$upscope $end $enddefinitions $end

0
$dumpvars
0!!RxCLK
1!!RxD
$end
#55
1!!RxCLK
#75
0!!RxD
#105
0!!RxCLK
#125
1!!RxD
#145
1!!RxCLK
#165
0!!RxD
#210
0!!RxCLK
#230
1!!RxD
#245
1!!RxCLK
#265
0!!RxD
```

FIG. 9A

```
$ date
        2/28/2004 1:30:15 PM
$end $version
        Drift Example
$end

$timescale
        1ps
$end $scope module U $end
$var wire 1 !!
$var wire 1 !!RxD ReceiveData
$end
$var wire 1 !!RxCLK ReceiveClock
$end
$upscope $end

$enddefinitions $end

0
$dumpvars
0!!RxCLK
1!!RxD
$end
#55
1!!RxCLK
#75
0!!RxD
#110
0!!RxCLK
#125
1!!RxD
165
1!!RxCLK
#165
0!!RxD
220
0!!RxCLK
#230
1!!RxD
#275
1!!RxCLK
#265
0!!RxD
```

SOURCE SYNCHRONOUS TIMING EXTRACTION, CYCLIZATION AND SAMPLING

RELATED APPLICATIONS

This is a continuation of application Ser. No. 10/790,960, filed on Mar. 1, 2004, now U.S. Pat. No. 7,100,132 the entire disclosure of which is incorporated herein by reference.

BACKGROUND OF THE INVENTION

The increasing reliance upon computer systems to collect, process, and analyze data has led to the continuous improvement of the system assembly process and associated hardware. With the improvements in speed and density of integrated circuits, the cost and complexities of designing and testing these integrated circuits has dramatically increased. Currently, integrated multi-functional Electronic Automation Design (EAD) tools are used to design and simulate integrated circuit devices. The design of an integrated circuit involves synthesizing device components to meet the device specification, including requirements for both device functionality and device timing. The design is typically verified against the device specification via simulation. A simulator, typically integrated into the EAD tool, simulates the operation of the design by applying a set of input stimulus to the synthesized design, and receiving and monitoring a set of simulated output responses. The input stimulus is designed to test the functionality and timing requirements of the device specification. The simulator compares the simulated output response to expected output response values to verify operation of the design. Once a design is satisfactorily verified against the device specification, a physical implementation of the device (i.e., a "prototype") is generated and tested using the simulation test data, including respective pairs of input stimulus and expected output response to verify expected operation of the physical device against the design.

Simulator tools generally output simulation test data, including respective pairs of input stimulus and expected output response, to files implementing what is known in the industry as "event-based" data formats. Examples of such event-based data formats include the IEEE Standard 1364-2001 Value Change Dump (VCD) format, or the IEEE Standard 1450-1999 Standard Test Interface Language (STIL) format. A VCD event-based data file, for example, typically contains header information, variable definitions (e.g., pin number or name definitions), and the timescale used. Next, the file typically contains definitions of the scope and type of variables being dumped, followed by the actual value changes at each simulation time increment. Only the variables that change value during a time increment are listed.

In contrast, the integrated circuit testers, typically large complex industrial Automated Test Equipment (ATE), operate according to fixed device cycles. Accordingly, ATE typically requires input test data in files implemented according to a "cycle-based" data format. A cycle-based data format generally includes a set of vectors and a set of waveforms defined by a fixed device cycle time.

The event-based data file format and cycle-based data file format are incompatible. Accordingly, in order to utilize the simulation test data generated by the simulator to verify operation of the prototype, or to verify operation of manufactured devices during production, the event-based simulation test data file must be converted to a cycle-based test data file(s) compatible with the ATE.

A translator tool typically performs the conversion of event-based simulation test data files to cycle-based test data file(s) appropriate for the particular ATE testing the prototype or device under test (DUT). One incompatibility problem with event-based simulation test data is that event-based data reflects one time point for each event. In the actual silicon, however, the time that an event may occur is actually a range between the best case and worst-case extremes. Providing the device timing diagrams, which contain the ambiguity regions of the signals' timing, allows the translator tool to identify the device cycle that the simulator executes, and then to test according to the device cycle specification as it appears in the timing diagrams to generate a test according to the actual device specification. Accordingly, the translator tool essentially imposes a fixed cycle on event-based simulation test data in order to extract, from the event-based simulation test data, separate waveforms (i.e., timing diagrams characterized by a fixed set of discrete behaviors) and corresponding separate data vectors (i.e., the sequence of those discrete behaviors) implemented in the cycle-based file format required by the particular ATE that will be testing the physical device.

Many integrated circuits designed and manufactured today are high-speed digital serial communication devices such as high-speed network communication devices including SerDes (Serializer/Deserializer), SONET, Gigabit Ethernet, InfiniBand and FibreChannel chips. Serial devices such as these rely on a clock signal to transmit and recover data. However, due to thermal and other variations, drift, jitter, and other timing irregularities may be introduced into the data during data transmission. To compensate for this, modern high-speed serial devices are often built to include an internal clock recovery system, and the clock signal is embedded within the serial data itself. The clock recovery circuitry on the serial receiver includes source synchronous functionality, which essentially performs a "snap to grid" on the clock signal, adjusting to any detected clock period deviations. "Source synchronous" refers to a circuit's ability to resynchronize to a clock that drifts, jitters, or exhibits other timing irregularities during data transmission.

In order to test the functionality of clock recovery circuitry on a serial device, test engineers often inject timing irregularities into the test data during simulation. This can be done manually by the design engineer, or automatically using a timing irregularity injection tool provided with the simulator. As just described, however, a conventional translator tool essentially imposes a fixed cycle on event-based simulation test data in order to extract a separate waveform (i.e., a timing diagram characterized by a fixed set of discrete behaviors) and corresponding separate data vector (the sequence of those discrete behaviors) from the simulation test data format. This is problematic when generating test vectors from a serial device simulation containing injected timing irregularities because, since the tester requires fixed period device cycles generated based on ideal device specification timing diagrams, the translator tool typically cannot match up event-based test data containing injected timing irregularities with the ideal timing diagrams of the device specification, and thus the cyclization engine is often unable to generate device cycles for this type of data. Thus, it is very difficult to generate cycle-based test data from event-based test data that contains such timing irregularities in order to test the source-synchronous hardware on these devices.

Some high speed serial devices are configured with an internal pattern generator for use in a test mode to provide capability for performing a loopback test. Loopback testing is one method for allowing a device to perform a self-test. In a loopback test, the device drivers are configured to connect to the device's own receivers. The device pattern generator generates test patterns, which are driven out the device's drivers and applied to the device's own receivers. Self-test circuitry within the device verifies proper operation of the device with respect to the applied test patterns, typically by merely comparing and verifying that the data received is the same as the test pattern that was sent out through the drivers. However, in order to test the self-test (loopback) functionality in the face of real-world timing irregularities such as noise, large delays, thermal drift from other data sources, voltage degradation, circuit board trace differences, and so forth, it would be desirable to have a technique for injecting timing irregularities into the self-generated test patterns.

Accordingly, a need exists for a tool that extracts and removes timing irregularities, such as drift and jitter, from event-based simulation test data that contains such injected timing irregularities, to generate corresponding "clean" cycle-based test data (i.e., fixed device cycles without the injected timing irregularities) in the format specific to the particular ATE testing the physical serial device. A need also exists for a technique for a tool that extracts such timing irregularities and provides the extracted timing irregularities to the ATE in a format usable by the ATE to allow the ATE to reinject the extracted timing irregularities into the "clean" cycle-based test data using the ATE's own timing irregularity injection module when testing the device. A need also exists for extracting and utilizing timing irregularities from event-based simulation test data for injection into test patterns that are self-generated by the device.

SUMMARY OF THE INVENTION

Embodiments of the invention include methods and apparatuses for injecting timing irregularities into test patterns self-generated by a device under test (DUT) which comprises output drivers, input receivers, and a pattern generator that generates and outputs the test patterns onto the output drivers. In one embodiment, a method includes the steps of obtaining timing irregularities, receiving the test patterns self-generated by the device under test driven from the one or more output drivers of the DUT, injecting the timing irregularities into the test patterns to generate test patterns with timing irregularities injected therein, and applying the test patterns with timing irregularities injected therein to the one or more input receivers of the DUT.

In an embodiment, a tester is configured to test loopback functionality of a device under test (DUT). The tester includes a timing irregularities injection apparatus which receives timing irregularity data readable by the tester and test data generated by the DUT, and injects the timing irregularity data into the test data for application to the DUT.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
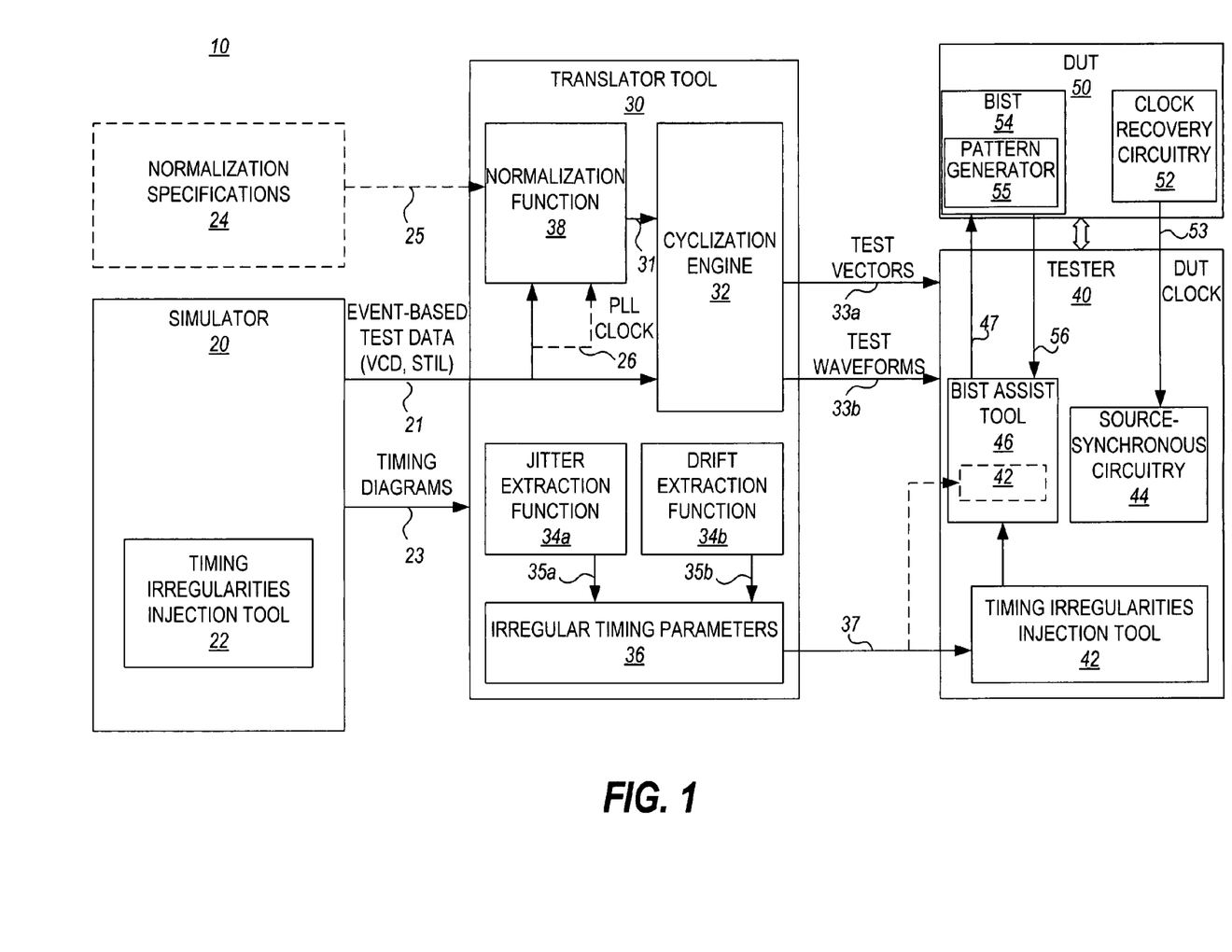
FIG. 1 is a block diagram of an integrated circuit design and test system that includes a translator tool implemented in accordance with the invention.

Turning now to the invention, FIG. 1 is a block diagram of an integrated circuit design and test system 10 that includes a translator tool 30 that implements the technique of the invention.

The input of the translator tool 30 is an event-based simulation test data file 21 containing simulated clock period timing irregularities in at least one of the data signals. In one embodiment, the clock period timing irregularities are introduced in order to test clock recovery circuitry 52 present on a device under test (DUT) 50 that is designed to compensate for such timing irregularities. As known in the art, the "period" of a waveform is the time required for one complete cycle of the wave to occur. In a clock synchronous system, it is desirable that the period of the clock signal is constant and that the clock cycles at precisely the same time during every clock period. Timing irregularities, or intrinsic period characteristic flaws, may take the form of clock jitter, clock drift, or other such clock period irregularities. "Clock jitter" is variation in time of the sampling edge of the clock signal. "Clock drift" is the linear (first order) component of a systematic change in frequency of an oscillator over time. Drift is caused by aging, by changes in the environment, and by other factors external to the oscillator. "Aging" is a change in frequency with time due to internal changes in an oscillator. Aging is usually a nearly linear change in the resonance frequency that can be either positive or negative, and occurs even when factors external to the oscillator, such as environment and power supply, are kept constant. Aging has many possible causes, including a buildup of foreign material on the crystal, changes in the oscillator circuitry, or changes in the quartz material or crystal structure.

An example event-based simulation test data file 21 is formatted according to the Value Change Dump (VCD) file format, an IEEE standard 1364-2001, which is incorporated herein by reference for all that it teaches. VCD logs changes to variable values, such as the values of signals, in a file during a simulation session.

Figure 2A:
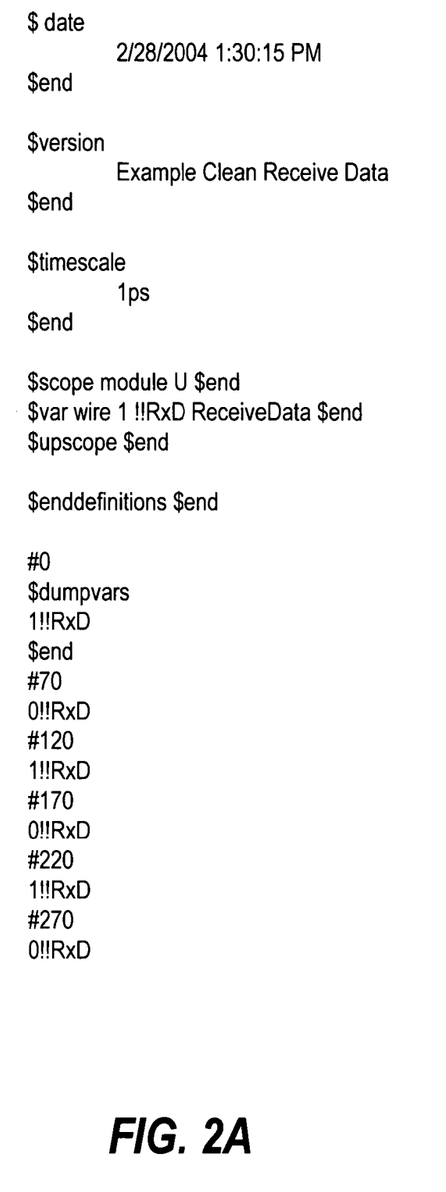
FIG. 2A is an excerpt of an example value change dump (VCD) simulation test data file illustrating simulated data that contains no timing irregularities.
Figure 2B:
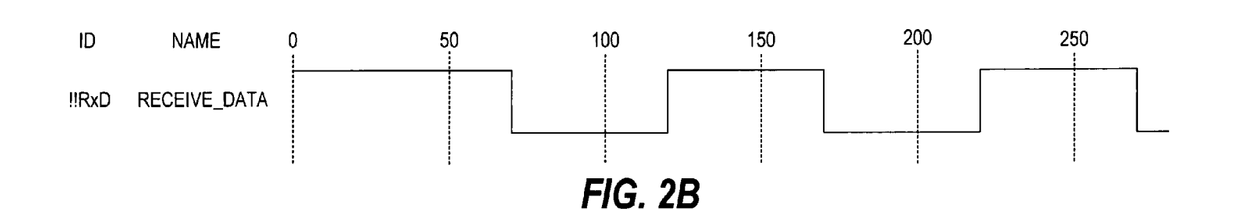
FIG. 2B is a timing diagram illustrating the waveform of the variable in the VCD file of FIG. 2A.

FIG. 2A illustrates an excerpt of an example VCD simulation test data file for a serial receive data variable ReceiveData generated by the simulator that contains no timing irregularities introduced into the data signals. FIG. 2B illustrates a timing diagram illustrating the waveforms of the serial receive data variable ReceiveData relative to the simulated timescale. As illustrated, the edges occur in synchronization with the timescale grid. The data period is 100 psec.

Figure 3A:
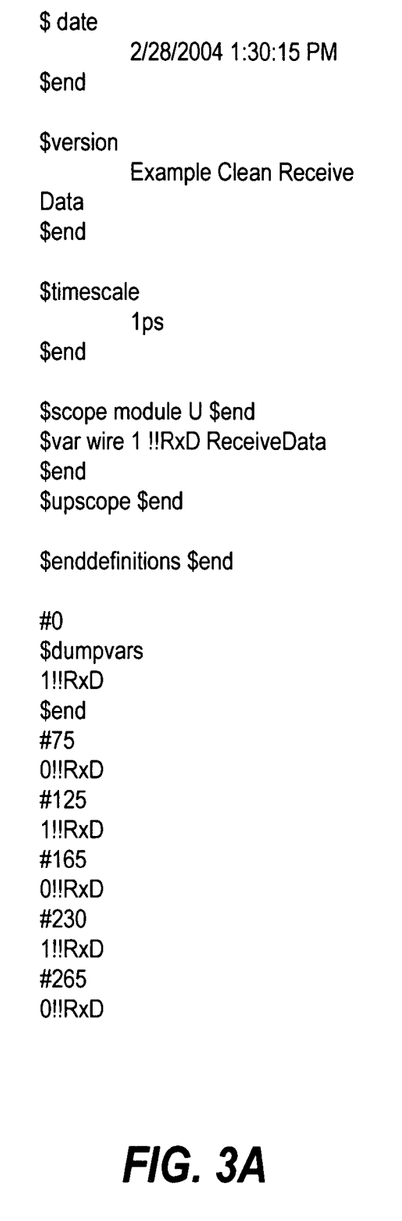
FIG. 3A is an excerpt of an example VCD simulation test data file illustrating simulated data that contains intentionally injected jitter.
Figure 3B:
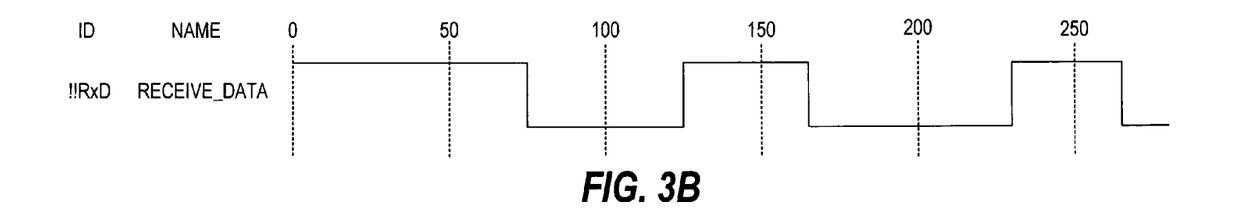
FIG. 3B is a timing diagram illustrating the waveform of the variable in the VCD file of FIG. 3A.

In order to test the clock recovery circuitry, a test engineer might utilize the timing irregularity injection tool to introduce timing irregularities in the simulation test data. For example, FIG. 3A illustrates an excerpt of an example VCD simulation test data file for the serial receive data variable ReceiveData of FIG. 2A generated by the simulator that introduces jitter into the data signals. FIG. 3B illustrates a timing diagram illustrating the waveforms of the serial receive data variable ReceiveData relative to the simulated timescale that is represented by the VCD file of FIG. 3A. As illustrated, the edges vary relative to the ideal clock period.

Figure 4A:
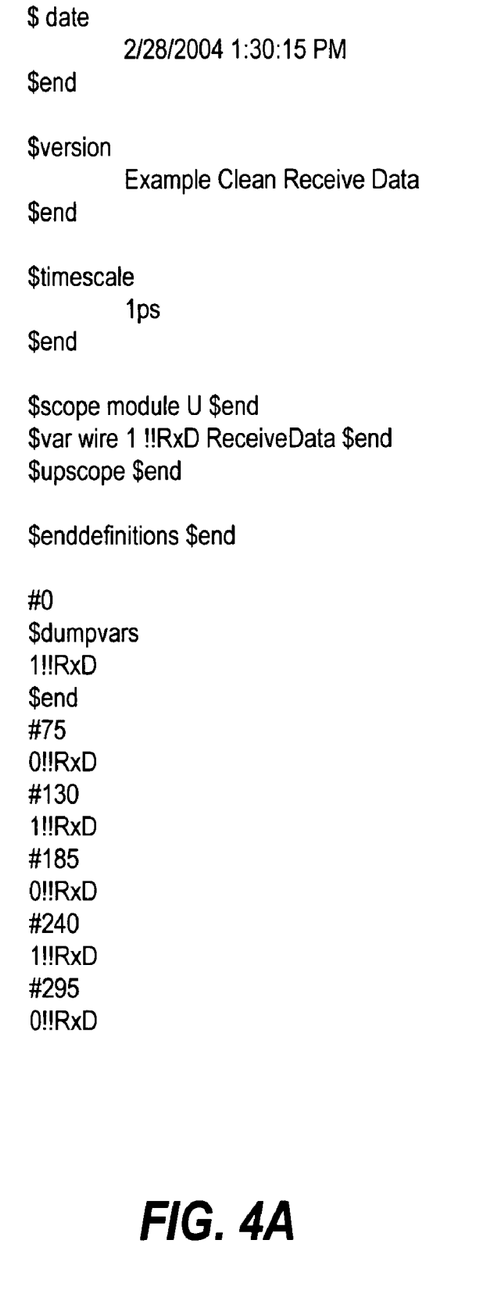
FIG. 4A is an excerpt of an example VCD simulation test data file illustrating simulated data that contains intentionally injected drift.
Figure 4B:
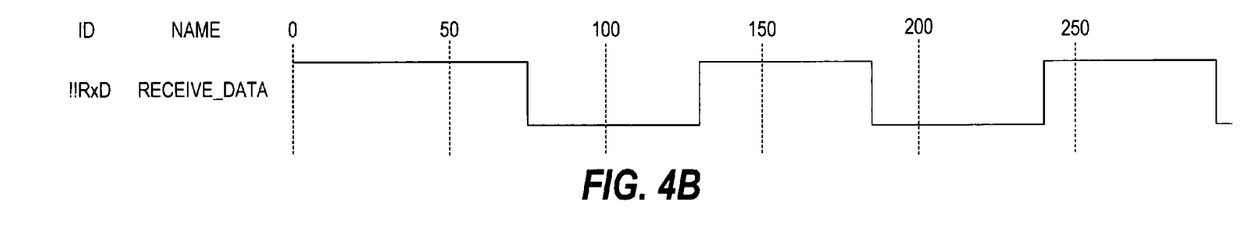
FIG. 4B is a timing diagram illustrating the waveform of the variable in the VCD file of FIG. 4A.

As another example, FIG. 4A illustrates an excerpt of an example VCD simulation test data file for the serial receive data variable ReceiveData of FIG. 2A generated by the simulator that introduces drift into the data signals. FIG. 4B illustrates a timing diagram illustrating the waveform of the serial receive data variable ReceiveData relative to the simulated timescale that is represented by the VCD file of FIG. 4A. As illustrated, the clock period increases linearly over time.

Figure 5A:
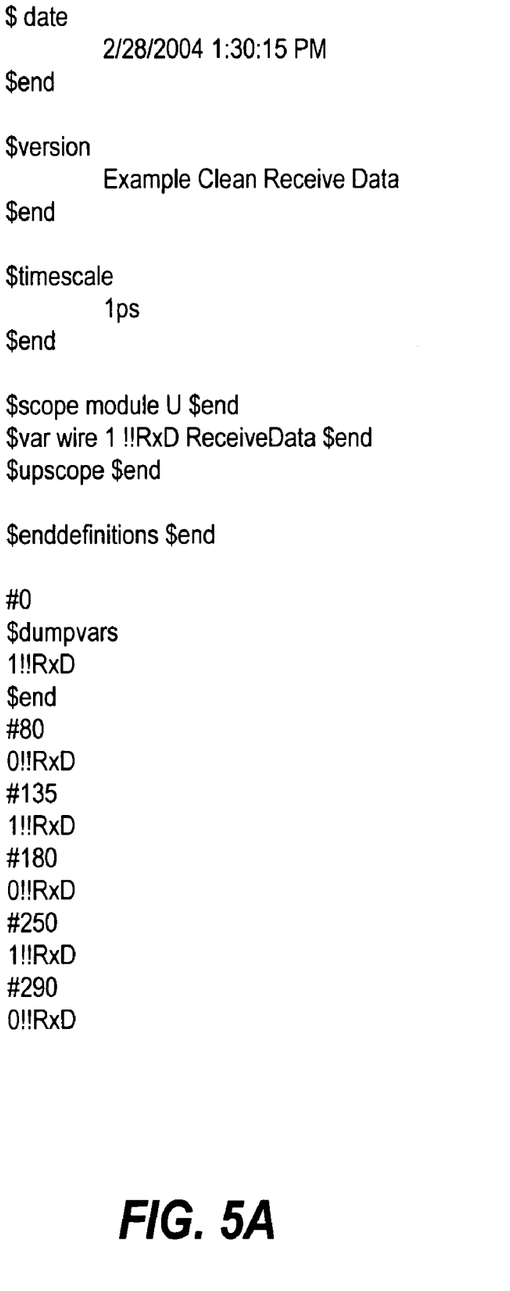
FIG. 5A is an excerpt of an example VCD simulation test data file illustrating simulated data that contains intentionally injected jitter and drift.
Figure 5B:
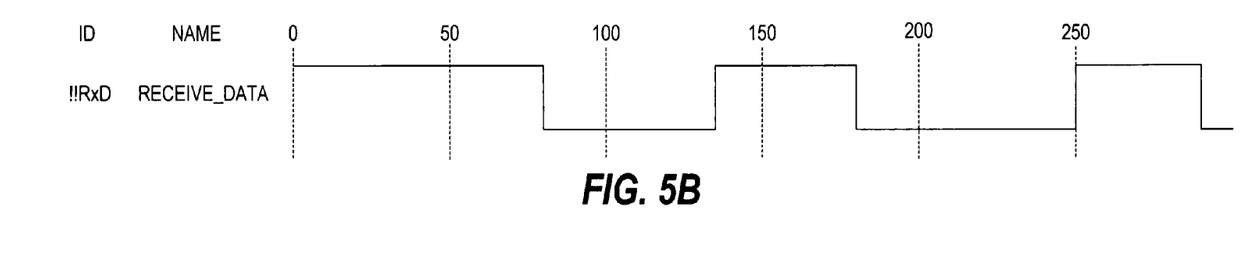
FIG. 5B is a timing diagram illustrating the waveform of the variable in the VCD file of FIG. 5A.

FIG. 5A illustrates an excerpt of an example VCD simulation test data file for the serial receive data variable ReceiveData of FIG. 2A generated by the simulator that introduces both jitter and drift into the data signals. FIG. 5B illustrates a timing diagram illustrating the waveform of the serial receive data variable ReceiveData relative to the simulated timescale that is represented by the VCD file of FIG. 5A. As illustrated, the clock period increases linearly over time and the transition edges vary relative to the drifting clock period.

As illustrated in the example VCD format file excerpts illustrated in FIGS. 3A, 4A, and 5A, an event-based file format supports the ability to include intrinsic clock period irregularities such as jitter and drift in simulated test data because the event-based data file logs only changes in the variable state and the time the change occurred.

The translator tool 30 preferably includes a cyclization engine 32. The cyclization engine 32 processes the event-based test data file 21 (e.g., a VCD formatted file) to extract a series of synchronized device cycles based on timing diagrams 23 describing the device specification. The timing diagrams 23 may be generated manually by a test engineer, or may be extracted from event-based data 21 using a timing extractor which reads the VCD simulation test data file 21 and generates a set of waveforms usable by the cyclization engine 32 for generating device cycles.

The cyclization engine 32 operates to match event-based test data 12 to waveforms described in the timing diagrams 23 to generate a series of fixed-period device cycles. In a cycle-based file format, if the event-based test data 21 includes timing irregularities such as jitter and drift, the cyclization engine 32 will be unable to match the irregularly timed data to the device timing diagrams 23 and cyclization cannot occur.

The translator tool 30 is therefore provided with a normalization function 38 that operates to remove timing irregularities from event-based simulation test data 21 containing intentionally injected timing irregularities to generate normalized event-based test data 31. This allows the cyclization engine 32 to cyclize the normalized event-based test data 31 against the device specification timing diagrams 23 to generate a set of "clean" data vectors 33a and waveforms 33b. During normalization, the timing irregularities are recorded in an irregular timing parameters memory 36. In one embodiment, the timing irregularities stored in the memory 36 are formatted into a separate file 37 that is accessible by the tester 40. In one embodiment, the tester 40 includes a timing irregularities injection tool 42 which reads the timing irregularities file and reinjects the simulated timing irregularities 37 into the clean data vectors 33a and waveforms 33b which are used to test the clock recovery circuitry 52 of the serial device 50.

In another embodiment, the tester 40 includes built-in self-test (BIST) assist tool 46 which is utilized to test BIST functionality of a DUT 50. The BIST assist tool 46 operates to connect DUT drivers which drive test patterns generated by a pattern generator 55 to DUT receivers for performing a loopback test. The BIST assist tool 46 may itself include the timing irregularities injection tool 42 or may operate in conjunction with the timing irregularities injection tool 42 that is implemented in the tester 40. In either case, the timing irregularities injection tool 42 receives timing irregularities 37, injects the timing irregularities into the test pattern data 56 generated by the BIST pattern generator 55 of the BIST 54 of the DUT 50, and applies the self-generated test patterns with timing irregularities injected therein 47 to the loopback receivers of the DUT 50. This allows loopback functionality testing with real-world conditions.

Figure 6:
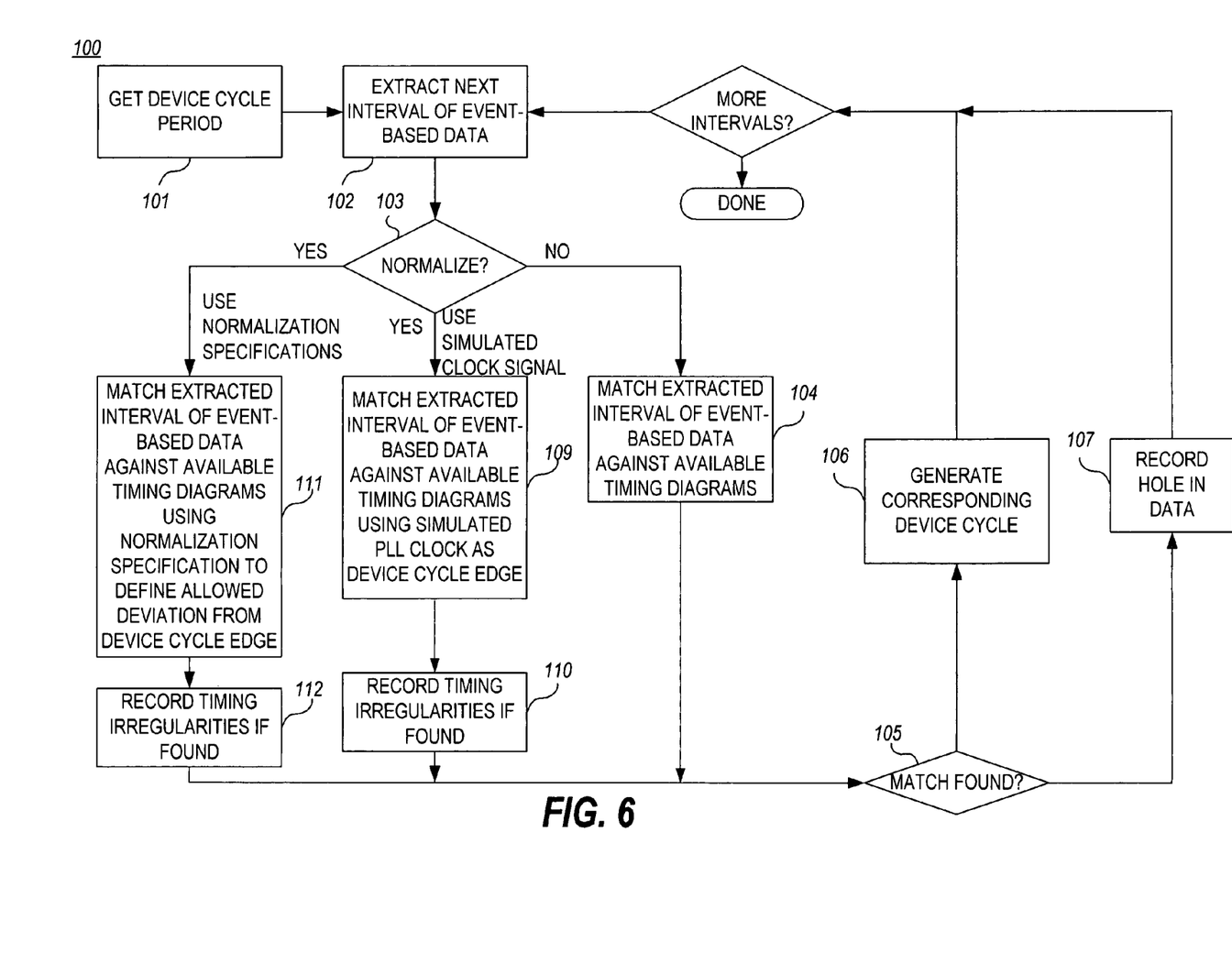
FIG. 6 is a flowchart illustrating an exemplary embodiment of a method of operation for performing the functionality of the cyclization engine in handling event-based test data comprising intentionally injected timing irregularities.

FIG. 6 is a flowchart illustrating a method of operation 100 of the cyclization engine 32 in handling event-based test data comprising intentionally injected timing irregularities. As illustrated, the method 100 obtains the fixed device cycle period (step 101). The cyclization engine 32 uses the device cycle period to impose a fixed timing grid on the device cycle vectors and waveforms for each timing interval. The cyclization engine 32 then extracts a first timing interval of event-based data (step 102). Typically, the cyclization engine 32 chooses a span of time in the event-based simulation test data 21 that is equal to the fixed device cycle period. For example, if the cyclization engine 32 were cyclizing the event-based test file of FIG. 2A, the cyclization engine might be instructed that the device cycle period is 100 psec. In this example, the cyclization engine 32 may then extract the first 100 psec of events from the event-based test data file of FIG. 2A. In the first 100 psec of events, variable ReceiveData transitions from logical 1 to logical 0 at 70 psec.

The cyclization engine 32 then determines whether it should perform normalization on the extracted timing interval of event-based data (step 103). Continuing with the present example in which the event-based test data 21 does not contain any intentionally injected timing irregularities, normalization need not be performed. Therefore, the cyclization engine 32 attempts to match the extracted interval of event-based data against available timing diagrams (step 104). If a match is found (as determined in step 105), a device cycle corresponding to the extracted interval is generated (step 106). In this regard, a data vector is appended to a cycle-based test data vector file 33a and a corresponding waveform is appended to a cycle-based test data waveform file 33b. If, on the other hand, a match is not found (as determined in step 105), a hole in the cyclized data is recorded (step 107). At this point, cyclization may end, or it may continue to try to cyclize the remaining event-based data intervals. If a match is found, or if a match is not found but cyclization is to continue, the cyclization engine 32 determines whether the event-based test data 21 includes additional timing intervals to be cyclized. If more event-based test data timing intervals remain to be cyclized, the cyclization engine repeats the process (steps 102 through 108) until all event-based test data has been cyclized, or until a hole has been discovered in the data which causes cyclization to end.

Suppose that instead of processing an event-based test data file in which no timing irregularities have been injected, the cyclization engine 32 instead processes an event-based test data file that does contain intentionally injected timing irregularities. In this case, the cyclization engine 32 may be instructed (e.g., in step 103) to perform normalization on the event-based test data 21 in order to allow the cyclization engine 32 to properly cyclize the data. In this regard, the cyclization engine 32 generates a sequence of fixed period device cycles (i.e., test vector file 33a and test waveform file 33b) and a separate timing irregularities file 37 that instructs the tester 40 how to reinject the timing irregularities 35a, 35b extracted from the test data 21. Returning to the method of FIG. 6, after extracting the first timing interval (step 102), the method 100 determines that normalization is to be performed (step 103). There are two preferred embodiments for performing normalization.

The first embodiment utilizes a clock signal 26 generated by the simulator 20 during simulation of the simulated device. Typically, the simulated clock signal is an internal signal generated by the device's clock recovery circuitry that is used by the clock recovery circuitry but is not generally made available outside the chip. During simulation, however, the simulator can easily include this data recovery clock signal available with the test data, and therefore in the first embodiment, the simulator 20 does provide the clock signal 26 as part of the simulated test data 21. The cyclization engine 32 synchronizes the device cycle period with the simulated device clock, essentially performing a "snap-to-grid" operation of the simulated device clock to the device cycle period grid. The cyclization engine 32 attempts to match the extracted interval of event-based data against available timing diagrams, compensating the timing of the data in the event-based data interval according to any time difference between the simulated device clock and the device cycle period (step 109). If any timing irregularities are discovered in the event-based data interval, the cyclization engine preferably records the timing irregularities 35a, 35b for use in generating a timing irregularities file 37 that instructs the tester how to reinject the timing irregularities extracted from the test data (step 110). If no match is found, a hole in the cyclized data is recorded. If a match is found (as determined in step 105), a device cycle corresponding to the extracted interval is generated (step 106). In this regard, a data vector is appended to a cycle-based test data vector file 33a and a corresponding waveform is appended to the cycle-based test data waveform file 33b. At this point, cyclization may end, or it may continue to try to cyclize the remaining event-based data intervals. If a match is found, or if a match is not found but cyclization is to continue, the cyclization engine determines whether the event-based test data includes additional timing intervals to be cyclized (step 108). If more event-based test data timing intervals remain to be cyclized, the cyclization engine 32 repeats the process (steps 102, 103, 109, 110, 105, 106 or 107, and 108) until all event-based test data 21 has been cyclized, or until a hole has been discovered in the data which causes cyclization to end.

The second embodiment utilizes a normalization specification 24 that is provided to the cyclization engine 32 along with the test data file 21. The normalization specification 24 specifies information such as the percentage variation that a given data signal is allowed to deviate from the ideal. The cyclization engine 32 attempts to match the extracted interval of event-based data 21 against available timing diagrams 23, allowing for the specified variation in the edge transitions of each data signal as defined in the normalization specification 24 (step 111). If any timing irregularities (i.e., deviations from the ideal matched waveform) are discovered in the event-based data interval, the cyclization engine 32 preferably records these timing irregularities 35a, 35b in memory 36 (step 112) for use in generating a timing irregularities file 37 usable by the tester 50 for reinjecting the timing irregularities extracted from the test data into the clean device cycles when testing the device under test 50. If a match is found, taking into account the allowed amount of deviation from the ideal (as determined in step 105), a device cycle corresponding to the extracted interval is generated in accordance with the ideal matched waveform (step 106). In this regard, a device cycle data vector is appended to the cycle-based test data vector file 33a and a corresponding device cycle waveform is appended to the cycle-based test data waveform file 33b. If no match is found, a hole in the cyclized data is recorded. At this point, cyclization may end, or it may continue to try to cyclize the remaining event-based data intervals. If a match is found, or if a match is not found but cyclization is to continue, the cyclization engine determines whether the event-based test data includes additional timing intervals to be cyclized. If additional event-based test data timing intervals remain to be cyclized, the cyclization engine repeats the process (steps 102, 103, 111, 112, 105, 106 or 107, and 108) until all event-based test data has been cyclized, or until a hole has been discovered in the data which causes cyclization to end.

Figure 7:
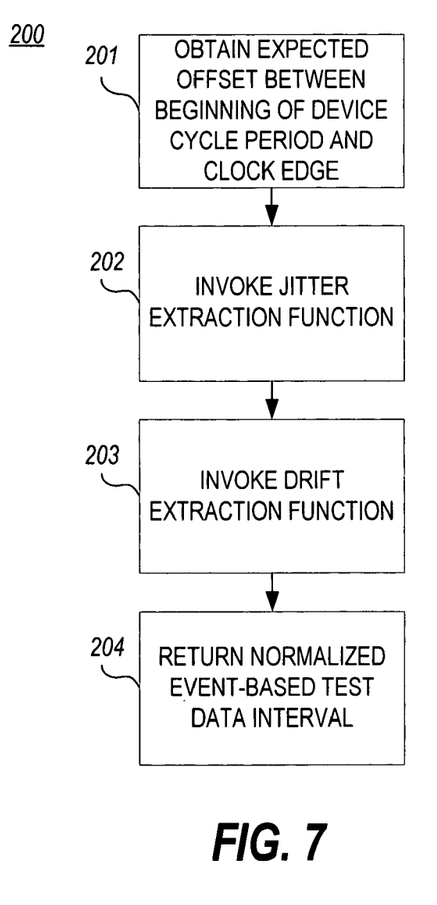
FIG. 7 is a flowchart illustrating an exemplary embodiment of a method for normalizing event-based test data using a simulated device clock.

Turning now in detail to an embodiment of the normalization function 38 of the translator tool 30 of FIG. 1, FIG. 7 is a flowchart illustrating a method of operation 200 for normalizing event-based test data using the simulated device clock. The method 200 obtains the expected offset between the beginning of device cycle period and the ideal device clock edge (step 201). The method 200 then invokes the jitter extraction function 34a (step 202), which extracts and removes any jitter from the event-based test data interval according to a method discussed hereinafter. The method 200 then invokes the drift extraction function 34b (step 203), which extracts and removes any drift from the event-based test data interval according to a method discussed hereinafter.

The method 200 then returns the normalized event-based test data interval, which is devoid of any jitter and/or drift.

Figure 8A:
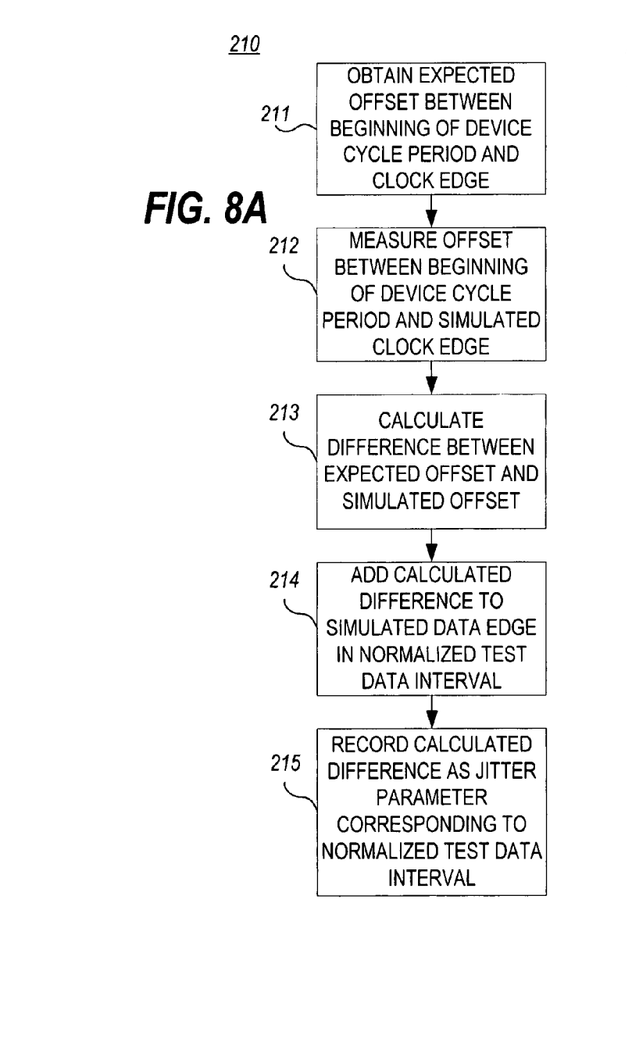
FIG. 8A is a flowchart of an exemplary embodiment of a jitter extraction method that utilizes the simulated device clock to extract jitter from event-based test data with intentionally injected jitter.
Figure 9A:
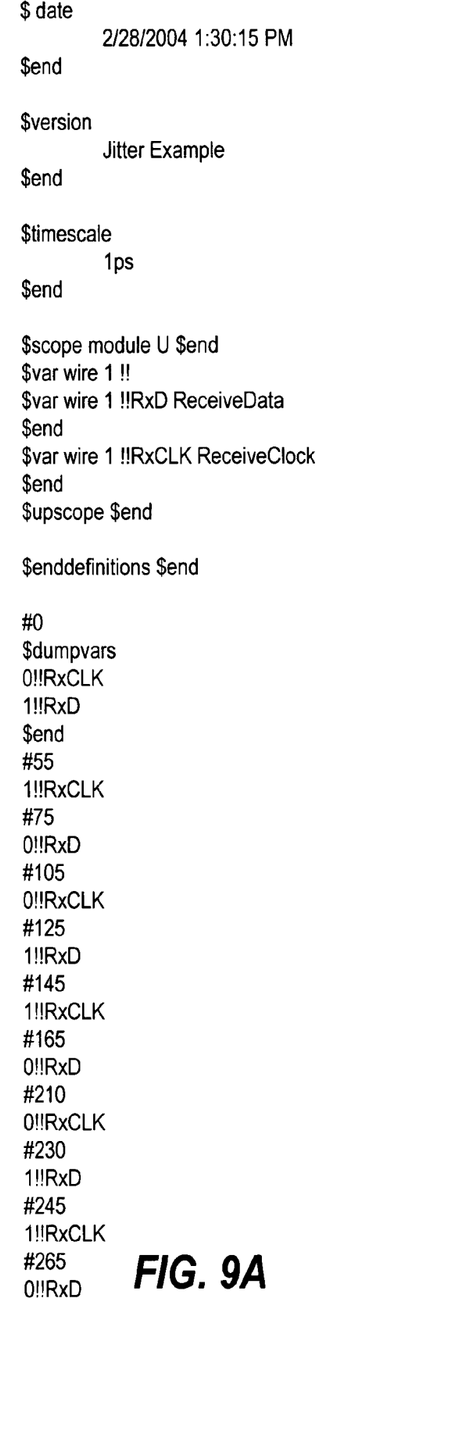
FIG. 9A is an example VCD file that includes a simulated clock recovery signal and a simulated serial data signal that includes intentionally injected jitter.
Figure 9B:
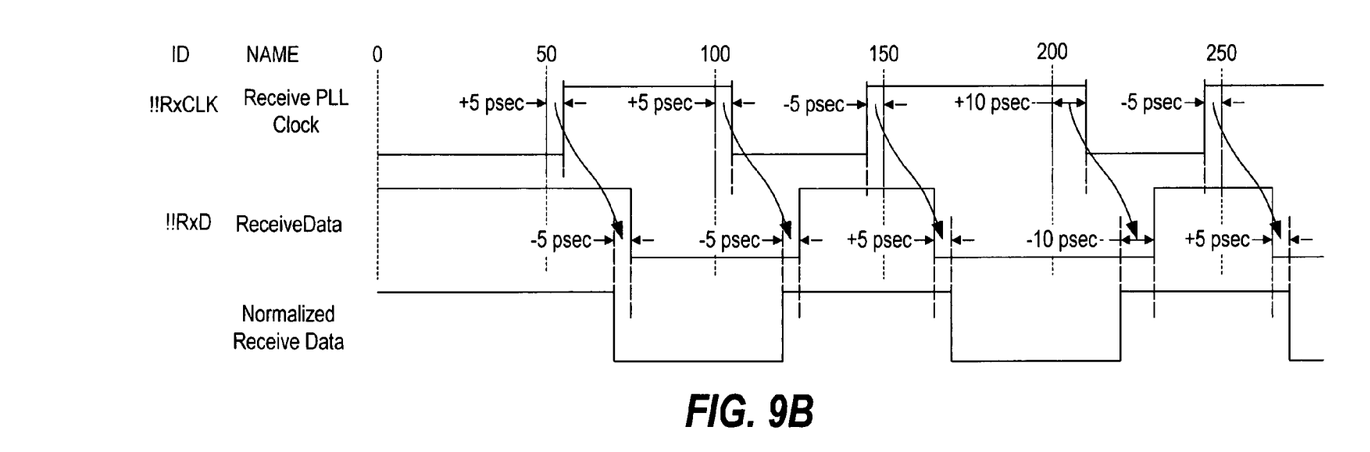
FIG. 9B is a timing diagram illustrating the simulated clock recovery signal and simulated serial data signal of FIG. 9A.

FIG. 8A is a flowchart of a method of operation 210 of an exemplary embodiment of a jitter extraction function 34a for the normalization function 38. When invoked, the method 210 obtains the expected offset between beginning of device cycle period and clock edge (step 211). Typically, the expected offset will be provided by the device specification or from a test engineer. The method 210 then measures the offset between beginning of device cycle period and the simulated clock edge (step 212). For example, FIG. 9A illustrates an example VCD file that is implemented according to the first embodiment of the invention in which the clock recovery signal ReceiveClk that is used in recovering the receive data ReceiveData is included in the change dump data. The received data signal ReceiveData includes intentionally injected jitter and is the same as that shown in FIG. 3A. In this example, the expected offset between the beginning of the device cycle period and the clock edge is 50 psec for the rising edge and 0 psec for the falling edge. FIG. 9B is a timing diagram illustrating the receive circuitry clock signal ReceiveClock, the simulated receive data signal ReceiveData, and the timing diagram of the normalized ReceiveData generated by the normalization function 38 which the cyclization engine 32 would attempt to match against available timing diagrams. As shown in the VCD file of FIG. 9A and the timing diagram of FIG. 9B, the offset from beginning of device cycle period and the simulated rising clock edge (step 212 of method 200 of FIG. 8A) in the first 100 psec time interval is +55 psec.

The method 210 then calculates the difference between expected offset and simulated offset (step 213). Continuing with the present example, the difference between expected offset (+50 psec) and simulated offset (+55 psec) is −5 psec. The method 210 then adds the calculated difference to simulated data edge in normalized test data interval (step 214). In the present example, as shown in FIGS. 9A and 9B, the simulated ReceiveData data signal edge is at +75 psec. Accordingly, the simulated ReceiveData data signal edge is normalized by −5 psec, resulting in a normalized edge at +70 psec. The method 210 then records the calculated difference as a jitter parameter indicating the amount of jitter to inject into the normalized cycle-based test data interval (step 215).

Figure 8B:
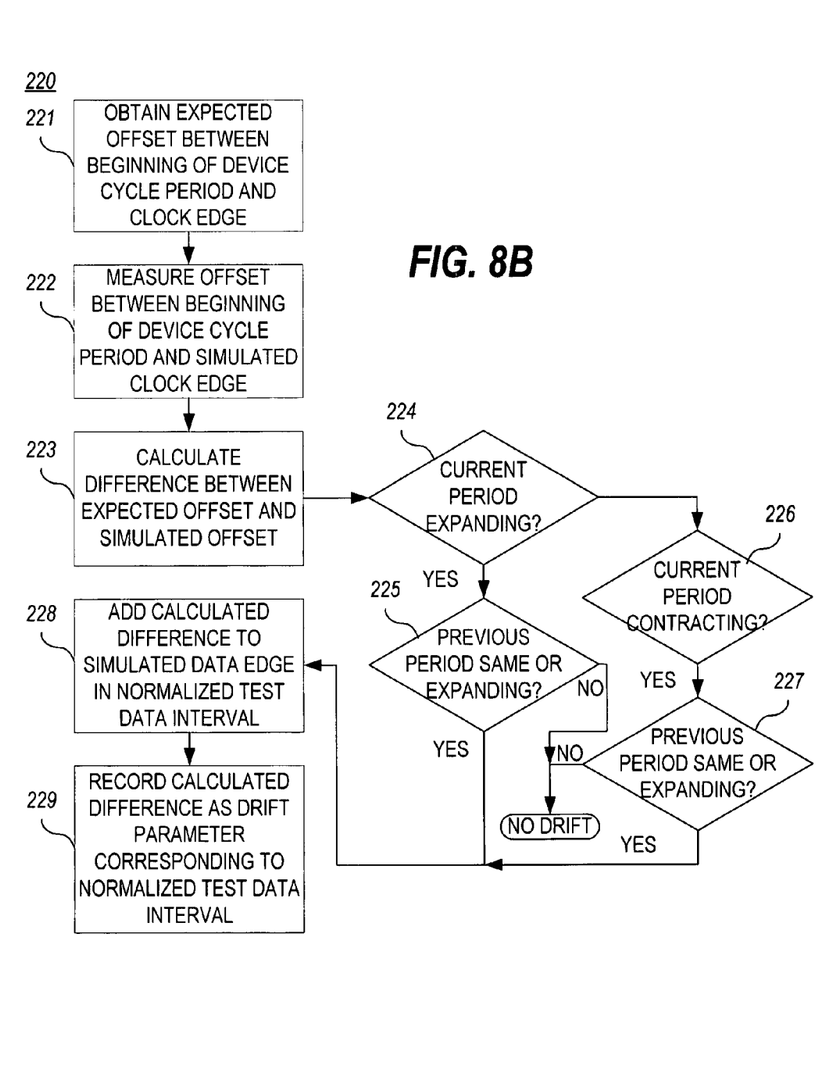
FIG. 8B is a flowchart of an exemplary embodiment of a drift extraction method that utilizes the simulated device clock to extract drift from event-based test data with intentionally injected drift.
Figure 10A:
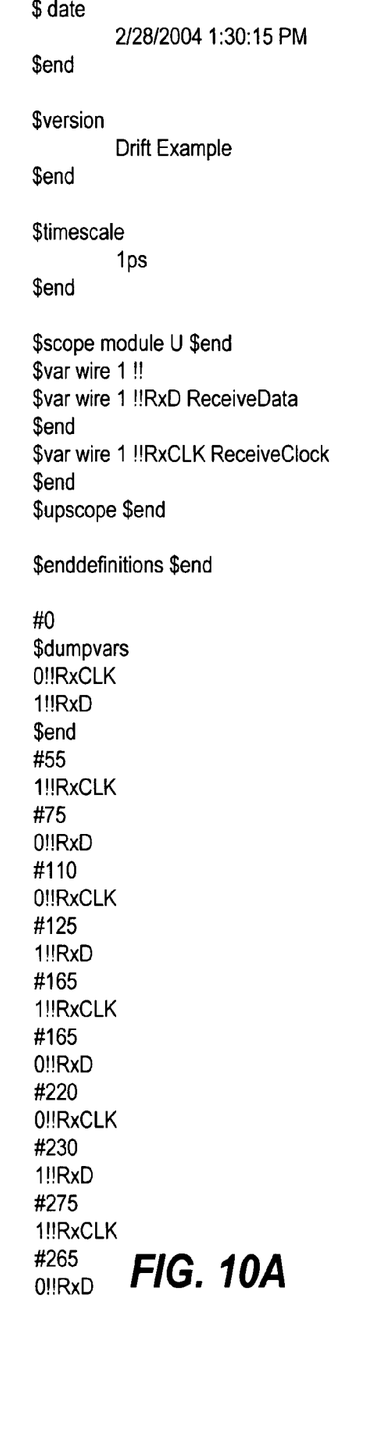
FIG. 10A is an example VCD file that includes a simulated clock recovery signal and a simulated serial data signal that includes intentionally injected drift.
Figure 10B:
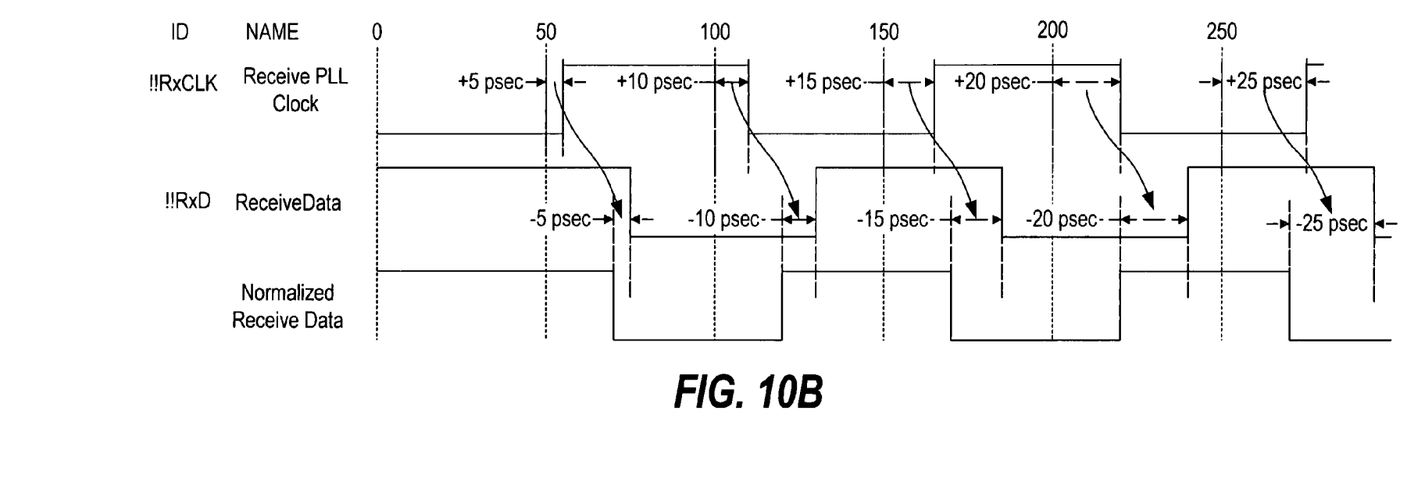
FIG. 10B is a timing diagram illustrating the simulated clock recovery signal and simulated serial data signal of FIG. 10A.

FIG. 8B is a flowchart of a method of operation 220 of an exemplary embodiment of the drift extraction function 34b for the normalization function 38. When invoked, the method 220 obtains the expected offset between beginning of device cycle period and clock edge (step 221). Typically, the expected offset will be provided by the device specification or from a test engineer. The method 220 then measures the offset between beginning of device cycle period and the simulated clock edge (step 222). For example, FIG. 10A illustrates an example VCD file that is implemented according to an embodiment in which the clock recovery signal ReceiveClk that is used in recovering the receive data ReceiveData is included in the change dump data. The received data signal ReceiveData includes intentionally injected drift and is the same as that shown in FIG. 4A. In this example, the expected offset between the beginning of the device cycle period and the clock edge is 50 psec for the rising edge and 0 psec for the falling edge. FIG. 10B is a timing diagram illustrating the receive circuitry clock signal ReceiveClock, the simulated receive data signal ReceiveData, and the timing diagram of the normalized ReceiveData generated by the normalization function 38 which the cyclization engine 32 would attempt to match against available timing diagrams. As shown in the VCD file of FIG. 10A and the timing diagram of FIG. 10B, the offset from the beginning of the device cycle period and the simulated rising clock edge (step 222 of method 220 of FIG. 8B) in the first 100 psec time interval is +55 psec.

The method 220 then calculates the difference between expected offset and simulated offset (step 223). Continuing with the example shown in FIGS. 10A and 10B, the difference between expected offset (+50 psec) and simulated offset (+55 psec) is −5 psec. The method 220 then determines whether the clock period of the current interval is expanding (step 224). This entails that the drift extraction function 34b stores information about previous intervals or, as in the preferred embodiment, the normalization function stores information about previous intervals and passes the information to the drift extraction function 34b as a parameter or as a pointer to a parameter that stores the information in memory (e.g., irregular timing parameter memory 36). Of course, on the first invocation of the drift extraction function 34b, previous information will be null. In order to determine whether the clock period of the current interval is expanding, the drift extraction function 34b preferably determines whether the calculated difference between expected offset and simulated offset has increased since the last interval. If it has, then the method 220 determines whether the clock period of the previous interval was expanding (step 225). If the clock period of both the current interval and the previous interval indicates clock period expansion, the method 220 adds the calculated difference to simulated data edge in normalized test data interval (step 228).

If the clock period of the previous interval did not indicate clock period expansion, then the drift extraction function 34b considers that the data does not indicate drift. However, the information of the present interval is preferably recorded to allow for the possibility of future drift.

If the clock period of the present interval did not indicate clock period expansion, the method 220 determines whether the clock period is contracting (step 226). Again, this entails storage of information about previous intervals, as previously discussed. In order to determine whether the clock period of the current interval is contracting, the drift extraction function 34b preferably determines whether the calculated difference between expected offset and simulated offset has decreased since the last interval. If it has, then the method 220 determines whether the clock period of the previous interval was contracting (step 227). If the clock period of both the current interval and the previous interval indicates clock period contraction, the method 220 adds the calculated difference to simulated data edge in normalized test data interval (step 228).

If the clock period of the previous interval did not indicate clock period contraction, then the method 220 considers that the data does not indicate drift. However, the information of the present interval is preferably recorded to allow for the possibility of future drift.

In the present example, as shown in FIGS. 10A and 10B, the simulated ReceiveData data signal edge drifts by +5 psec every 100 psec interval. Accordingly, the simulated ReceiveData data signal edge is normalized by −5 psec every 100 psec interval using the routing of FIG. 8B.

Figure 11A:
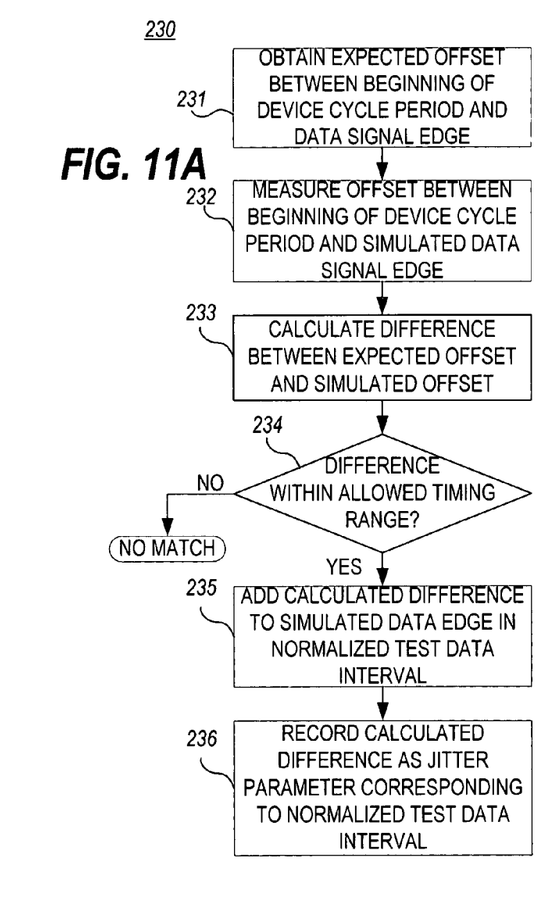
FIG. 11A is a flowchart of an exemplary embodiment of a jitter extraction method that utilizes a normalization specification to extract jitter from event-based test data with intentionally injected jitter.

Turning now in detail to an alternative embodiment of the normalization function 38 of the translator tool 30 of FIG. 1, FIG. 11A is a flowchart illustrating a method of operation 230 for extracting jitter from event-based test data using a normalization specification 24. The normalization specification contains information defining allowed ranges within which data signals contained in the simulated test data file 21 must transition to meet device specifications. Typically, for a given data signal, the normalization specification will include a minimum transition time and a maximum transition time. The normalization specification may tie minimum transition times and maximum transition times for certain data signals to the transition times of other simulated data signals.

The method 230 obtains the expected offset between the beginning of device cycle period and the ideal data signal edge (step 231). Typically, the expected offset will be provided by the device specification or from a test engineer. The method 230 then measures the offset between beginning of device cycle period and the simulated data signal edge (step 232). Referring to the example of FIGS. 9A and 9B, the expected offset between the beginning of the device cycle period and the data signal edge is 20 psec for the rising edge and 70 psec for the falling edge. As shown in the VCD file of FIG. 9A and the timing diagram of FIG. 9B, the offset from beginning of device cycle period and the simulated falling clock edge (step 232 of method 230 of FIG. 11A) in the first 100 psec time interval is +75 psec.

The method 230 then calculates the difference between expected offset and simulated offset (step 233). Continuing with the present example, the difference between expected offset (+70 psec) and simulated offset (+75 psec) is −5 psec. The method then determines whether the difference between expected offset (+70 psec) and simulated offset (+75 psec) is within the time range allowed by normalization specification for this data signal. If not, then there cannot be a match between the event-based test data interval and the current waveform that is being tested against. If the edge does occur within the allowed time range, the method 230 adds the calculated difference to simulated data edge in normalized test data interval (step 235). In the present example, as shown in FIGS. 9A and 9B, the simulated ReceiveData data signal edge is at +75 psec. Accordingly, the simulated ReceiveData data signal edge is normalized by −5 psec, resulting in a normalized edge at +70 psec. The method 230 then records the calculated difference as a jitter parameter indicating the amount of jitter to inject into the normalized cycle-based test data interval (step 236).

Figure 11B:
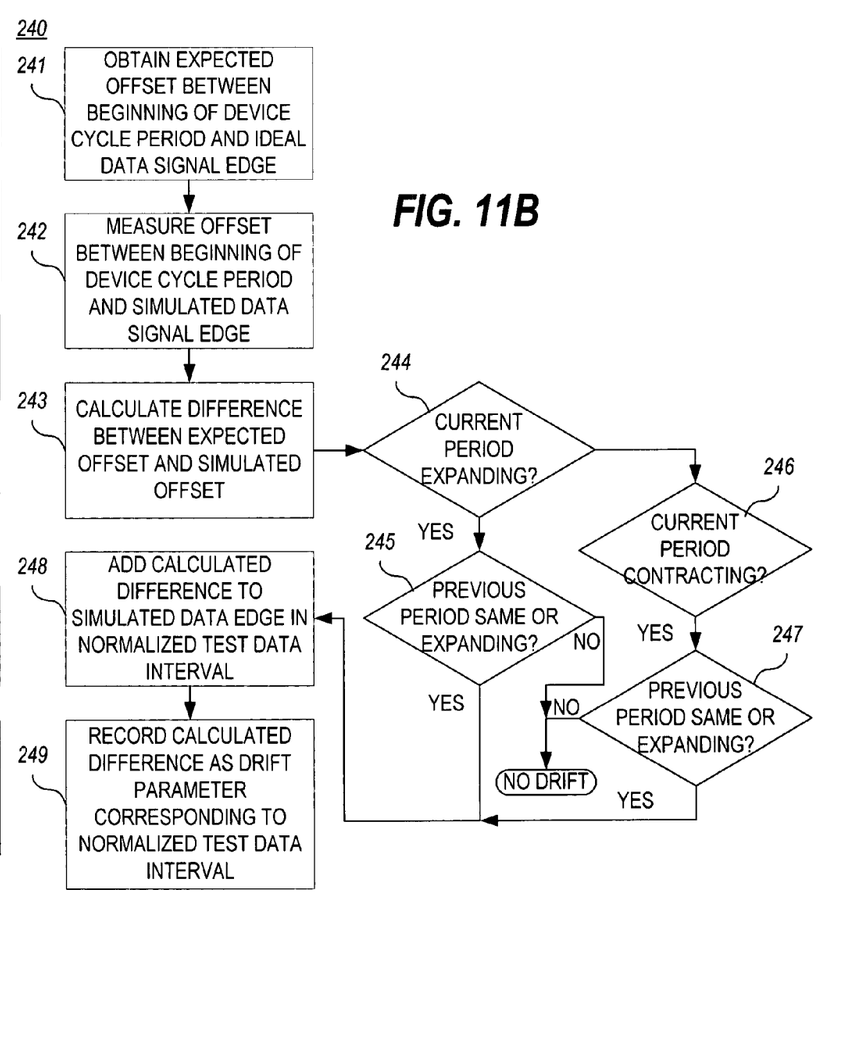
FIG. 11B is a flowchart of an exemplary embodiment of a drift extraction method that utilizes a normalization specification to extract drift from event-based test data with intentionally injected drift.

FIG. 11B is a flowchart of a method of operation 240 of an exemplary embodiment of the drift extraction function 34b for an embodiment of the normalization function 38 in which a normalization specification 24 is utilized to normalize the event-based test data. When invoked, the method 240 obtains the expected offset between the beginning of device cycle period and the ideal data signal edge (step 241). Typically, the expected offset will be provided by the device specification or from a test engineer. The method 240 then measures the offset between beginning of device cycle period and the simulated data signal edge (step 242). Referring to the example of FIGS. 10A and 10B, the expected offset between the beginning of the device cycle period and the data signal edge is 20 psec for the rising edge and 70 psec for the falling edge. As shown in the VCD file of FIG. 10A and the timing diagram of FIG. 10B, the offset from beginning of device cycle period and the simulated falling data signal edge in the first 100 psec time interval is +75 psec.

The method 240 then calculates the difference between expected offset and simulated offset (step 243). Continuing with the example shown in FIGS. 10A and 10B, the difference between expected offset (+70 psec) and simulated offset (+75 psec) is −5 psec. The method 240 then determines whether the clock period of the current interval is expanding (step 244). This entails that the drift extraction function 34b stores information about previous intervals or, as in the preferred embodiment, the normalization function stores information about previous intervals and passes the information to the drift extraction function 34b as a parameter or as a pointer to a parameter that stores the information in memory (e.g., irregular timing parameter memory 36). Of course, on the first invocation of the drift extraction function 34b, previous information will be null. In order to determine whether the clock period of the current interval is expanding, the drift extraction function 34b preferably determines whether the calculated difference between expected offset and simulated offset has increased since the last interval. If it has, then the method 240 determines whether the clock period of the previous interval was expanding (step 245). If the clock period of both the current interval and the previous interval indicates clock period expansion, the method 240 adds the calculated difference to simulated data edge in normalized test data interval (step 248).

If the clock period of the previous interval did not indicate clock period expansion, then the method 240 considers that the data does not indicate drift. However, the information of the present interval is preferably recorded to allow for the possibility of future drift.

If the clock period of the present interval did not indicate clock period expansion, the method 240 determines whether the clock period is contracting (step 246). Again, this entails storage of information about previous intervals, as previously discussed. In order to determine whether the clock period of the current interval is contracting, the method 240 preferably determines whether the calculated difference between expected offset and simulated offset has decreased since the last interval. If it has, then the method 240 determines whether the clock period of the previous interval was contracting (step 247). If the clock period of both the current interval and the previous interval indicates clock period contraction, the method 240 adds the calculated difference to simulated data edge in normalized test data interval (step 248).

If the clock period of the previous interval did not indicate clock period contraction, then the method 240 considers that the data does not indicate drift. However, the information of the present interval is preferably recorded to allow for the possibility of future drift.

In the present example, as shown in FIGS. 10A and 10B, the simulated ReceiveData data signal edge drifts by +5 psec every 100 psec interval. Accordingly, the simulated ReceiveData data signal edge is normalized by −5 psec every 100 psec interval using the routing of FIG. 11B.

Returning now to FIG. 1, as just described, the normalization function 38 normalizes event-based test data containing intentionally injected timing irregularities to generate normalized (or "clean") event-based test data 31 with the injected timing irregularities removed. The cyclization engine 32 then operates to cyclize the normalized event-based test data 31 to generate a "clean" set of cycle-based test vectors 33a and a "clean" set of cycle-based waveforms 33b that are compatible with the required file format of the tester 40. The tester 40 may use the test vectors 33a and test waveforms 33b to test the device under test 50 without any of the simulated timing irregularities. However, in order to test the clock recovery circuitry 52, the simulated timing irregularities need to be reinjected back into the test vectors 33a and corresponding test waveforms 33b.

As previously described, the jitter extraction function 34a and drift extraction function 34b preferably record the extracted timing irregularities in a timing irregularities file 37. In the preferred embodiment, the tester comprises a timing irregularities tool 42 that reads the timing irregularities file 37 and reinjects the timing irregularities defined in the timing irregularities file 37 into the corresponding device cycles of the test data (comprising test vectors 33a and corresponding test waveforms 33b) prior to applying the test data to the device under test 50 for testing. As known in the art, the test data 33a, 33b also includes the expected responses. This allows the tester to determine whether or not the clock recovery circuitry 52 of the physical device under test 50 is operating according to specification.

In addition, the tester 40 preferably includes source synchronous circuitry 44. The source synchronous circuitry 44 includes a reference clock input that is connectable directly to the DUT clock recovery circuitry clock 53 to allow the tester to monitor how well the clock recovery circuitry 52 of the device under test 50 is adapting to the intentionally injected timing irregularities. This is important in determining whether the clock recovery circuitry 52 is adapting to timing irregularities at a level within the device specification. The tester can then compare how well the clock recovery circuitry 52 of the DUT 50 is operating to recover simulated data to the level of recovery expected via the simulation results.

In order to test the loopback functionality of the BIST 54, the simulated timing irregularities need to be injected into the test patterns 56 generated by the BIST pattern generator 55. In this embodiment, a timing irregularities tool 42 is implemented in either the tester 40 (as shown), or alternatively, within the BIST Assist tool 46. Again, the timing irregularities tool 42 obtains timing irregularities 37 and injects them into the test patterns 56 generated by the BIST pattern generator 55 prior to applying the test patterns with timing irregularities therein 47 to the loopback receivers of the DUT 50. This allows the tester to determine whether or not the loopback functionality of the BIST 54 of the physical device under test 50 is operating according to specification.

Figure 12:
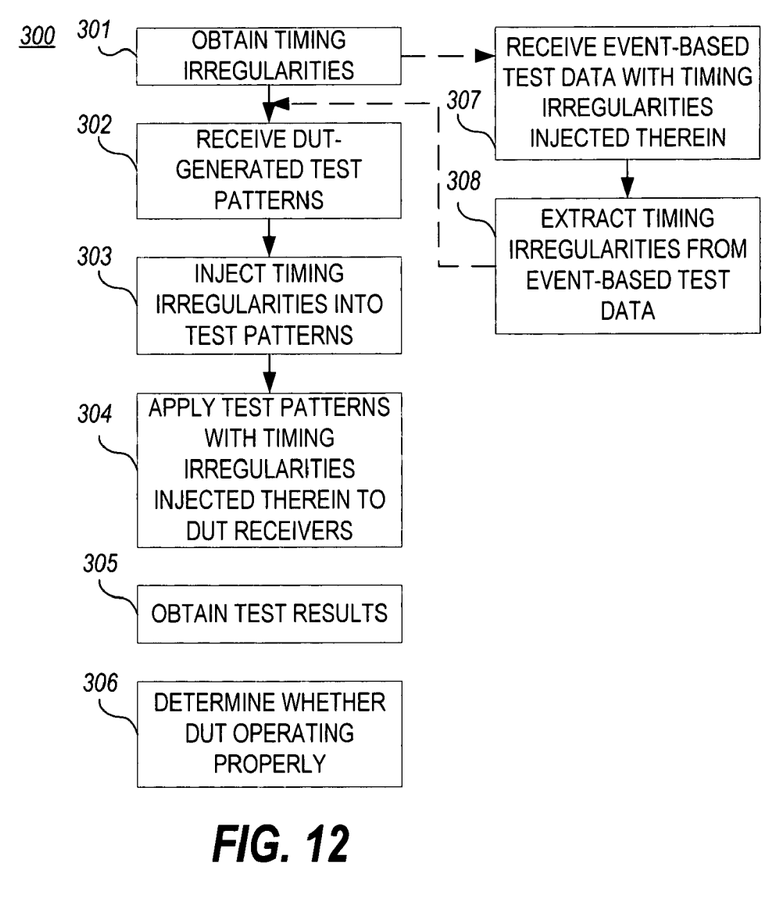
FIG. 12 is a flowchart of an embodiment of a method for injecting timing irregularities into test patterns self-generated by a device under test (DUT).

FIG. 12 is a flowchart of an embodiment of a method 300 for injecting timing irregularities into test patterns self-generated by a DUT. In the method, timing irregularities are obtained (step 301). In one embodiment, the timing irregularities are obtained by receiving event-based test data containing intentionally injected timing irregularities (step 7), and extracting the timing irregularities from the event-based test data (step 8).

Once the timing irregularities are obtained, test patterns self-generated by the device under test and driven from the one or more output drivers of the DUT are received (step 2). The timing irregularities are then injected into the test patterns to generate test patterns with timing irregularities injected therein (step 3). The test patterns with timing irregularities injected therein are then applied to one or more input receivers of the DUT (step 4). Test results may then be obtained from the DUT (step 5), from which it may be determined whether or not the DUT, and specifically the loopback functionality of the DUT, is operating properly (step 6).

Although this preferred embodiment of the present invention has been disclosed for illustrative purposes, those skilled in the art will appreciate that various modifications, additions and substitutions are possible, without departing from the scope and spirit of the invention as disclosed in the accompanying claims. For example, it should be understood that the translator tool 30 includes processing means such as a microprocessor, an FPGA, a computer, or other such computerized hardware, and memory that stores program instructions that implement the functionality of any one or more of the normalization function, the cyclization engine, the jitter extraction function, and the drift extraction function. It will be further understood that any of the program instructions that implement the functionality of any one or more of the normalization function, the cyclization engine, the jitter extraction function, and the drift extraction function can be stored on a computer readable storage medium herein known or hereinafter developed tangibly embodying these program instructions. It is also possible that other benefits or uses of the currently disclosed invention will become apparent over time.

What is claimed is:

1. A tester for testing loopback functionality of a device under test (DUT), comprising:
    a timing irregularities injection apparatus which receives timing irregularity data readable by the tester and test data generated by the DUT, and injects the timing irregularity data into the test data for application to the DUT; and
    a timing irregularity extraction function that extracts the timing irregularity data from event-based test data intentionally injected with timing irregularities, for injection into the test data by the timing irregularities injection apparatus.

2. The tester of claim 1, further comprising:
    loopback connection means which connect to one or more output drivers of the DUT for receiving the test data generated by the DUT, and which connect to one or more input receivers of the DUT for applying the test data injected with the timing irregularity data to the DUT.

3. The tester of claim 1, wherein:
    said timing irregularity data comprises clock period jitter.

4. The tester of claim 1, wherein:
    said timing irregularities comprise clock period drift.

5. A method for injecting timing irregularities into test patterns self-generated by a device under test (DUT), the DUT comprising one or more output drivers and one or more input receivers and a pattern generator that generates the test patterns which are output onto the one or more output drivers, the method comprising:
    obtaining timing irregularities by,
        receiving event-based test data containing intentionally injected timing irregularities; and
        extracting the timing irregularities from the event-based test data;
    receiving the test patterns self-generated by the device under test driven from the one or more output drivers of the DUT;
    injecting the timing irregularities into the test patterns to generate test patterns with timing irregularities injected therein; and
    applying the test patterns with timing irregularities injected therein to the one or more input receivers of the DUT.

6. The method of claim 5, further comprising:
    obtaining test results from the DUT, the test results indicating device operation based on the test patterns with timing irregularities injected therein received by the one or more input receivers of the DUT; and
    determining whether the DUT is operating properly based on the test results.

7. The method of claim 5, wherein:
    said timing irregularities comprise clock period jitter.

8. The method of claim 5, wherein:
    said timing irregularities comprise clock period drift.

9. A non-transitory computer readable storage medium tangibly embodying program instructions implementing a method for injecting timing irregularities into test patterns self-generated by a device under test (DUT), the DUT comprising one or more output drivers and one or more input receivers and a pattern generator that generates the test patterns which are output onto the one or more output drivers, the method comprising:
    obtaining timing irregularities by, receiving event-based test data containing intentionally injected timing irregularities; and extracting the timing irregularities from the event-based test data;

receiving the test patterns self-generated by the device under test driven from the one or more output drivers of the DUT;

injecting the timing irregularities into the test patterns to generate test patterns with timing irregularities injected therein; and applying the test patterns with timing irregularities injected therein to the one or more input receivers of the DUT.

10. The non-transitory computer readable storage medium of claim 9, the method further comprising:

obtaining test results from the DUT, the test results indicating device operation based on the test patterns with timing irregularities injected therein received by the one or more input receivers of the DUT; and determining whether the DUT is operating properly based on the test results.

11. The non-transitory computer readable storage medium of claim 9, wherein:

the timing irregularities comprise clock period jitter.

12. The non-transitory computer readable storage medium of claim 9, wherein:

the timing irregularities comprise clock period drift.

\* \* \* \* \*